United States Patent
Aksin

(10) Patent No.: US 11,088,665 B2
(45) Date of Patent: Aug. 10, 2021

(54) LINEAR BROADBAND TRANSCONDUCTANCE AMPLIFIER

(71) Applicant: Analog Devices, Inc., Norwood, MA (US)

(72) Inventor: Devrim Yilmaz Aksin, Stokesdale, NC (US)

(73) Assignee: Analog Devices, Inc., Norwood, MA (US)

( * ) Notice: Subject to any disclaimer, the term of this patent is extended or adjusted under 35 U.S.C. 154(b) by 57 days.

(21) Appl. No.: 16/590,911

(22) Filed: Oct. 2, 2019

(65) Prior Publication Data
US 2021/0104988 A1  Apr. 8, 2021

(51) Int. Cl.
H03F 3/45 (2006.01)

(52) U.S. Cl.
CPC ..... *H03F 3/45488* (2013.01); *H03F 3/45085* (2013.01); *H03F 2203/45631* (2013.01)

(58) Field of Classification Search
CPC ........................................................ H03F 3/45
USPC ................................................. 330/260, 252
See application file for complete search history.

(56) References Cited

U.S. PATENT DOCUMENTS

| | | | |
|---|---|---|---|
| 5,307,024 A | 4/1994 | Metz et al. | |
| 5,436,594 A | 7/1995 | Pace et al. | |
| 5,917,379 A | 6/1999 | Ashby et al. | |
| 6,118,340 A | 9/2000 | Koen | |
| 6,150,885 A | 11/2000 | Ashby et al. | |
| 6,600,367 B2 | 7/2003 | Candy | |
| 6,605,998 B2 | 8/2003 | Kimura | |
| 6,704,560 B1 | 3/2004 | Balteanu et al. | |
| 6,888,406 B2 | 5/2005 | Ashby et al. | |
| 7,215,200 B1 | 5/2007 | Hauser | |
| 8,319,553 B1 | 11/2012 | Ivanov | |
| 9,236,841 B2 | 1/2016 | Ciubotaru | |
| 9,590,576 B2 * | 3/2017 | Tatsumi | ............. H03F 3/45085 |
| 2018/0212573 A1 | 7/2018 | Day | |

FOREIGN PATENT DOCUMENTS

| | | |
|---|---|---|
| CN | 101001078 A | 7/2007 |
| KR | 20070092356 A | 9/2007 |

OTHER PUBLICATIONS

Hsu, Cheng-Chung, et al., "A Highly Linear 125-MHz CMOS Switched-Resistor Programmable-Gain Amplifier", IEEE Journal of Solid-State Circuits. 38(10), (Oct. 2003), 1663-1670.

* cited by examiner

*Primary Examiner* — Henry Choe
(74) *Attorney, Agent, or Firm* — Schwegman Lundberg & Woessner, P.A.

(57) ABSTRACT

An amplifier circuit comprises a differential input stage and a differential output stage. The differential input stage includes a first differential input transistor pair coupled to a differential input of the amplifier circuit, and a second differential input transistor pair coupled to the differential input and the differential output stage; a degeneration impedance coupled between first transistors of the first and second differential input transistor pairs and second transistors of the first and second differential input transistor pairs; and a feedback circuit coupled to the first and second differential input transistor pairs and the degeneration impedance, wherein output current is provided from the differential input stage to the differential output stage by the feedback circuit and transition current is provided to the output stage by the second differential input transistor pair.

22 Claims, 3 Drawing Sheets

US 11,088,665 B2

LINEAR BROADBAND TRANSCONDUCTANCE AMPLIFIER

FIELD OF THE DISCLOSURE

This document relates to integrated circuits and in particular to transconductance amplifier circuits.

BACKGROUND

Broadband linear amplifiers are one of the major building blocks of many modern electronic systems used within a wide range of markets, such as communication, military, automotive, industrial. Linearity of the amplifiers refers to the ability to linearly provide gain to an input signal without adding higher order components to the amplified signal. These amplifiers are used to provide wide amplification bandwidth to be able to process the fundamental input signal frequency in a linear fashion, such as driving a giga-sample per second analog to digital converter (ADC) for example. The fundamental input signal frequency to be processed by such amplifiers is ever-increasing for a variety of reasons. The linearity and the signal bandwidth of an amplifier set an upper bound to the dynamic range of an electronics system at a given operating frequency. However, there is typically a trade-off of linearity with bandwidth and power consumption of the amplifier circuit. The present inventor has recognized a need for improvement in broadband linear amplifier circuits.

SUMMARY OF THE DISCLOSURE

This document relates generally to linear broadband amplifiers. In some aspects, an amplifier circuit includes a differential input stage and a differential output stage. The differential input stage includes a first differential input transistor pair coupled to a differential input of the amplifier circuit, and a second differential input transistor pair coupled to the differential input and the differential output stage; a degeneration impedance coupled between first transistors of the first and second differential input transistor pairs and second transistors of the first and second differential input transistor pairs; and a feedback circuit coupled to the first and second differential input transistor pairs and the degeneration impedance, wherein output current is provided from the differential input stage to the differential output stage by the feedback circuit and transition current is provided to the output stage by the second differential input transistor pair.

In some aspects, a method of operating an amplifier circuit includes providing an output current from a differential input stage of the amplifier circuit to a differential output stage of the amplifier circuit; and regulating the output current using a feedback circuit connected to a first differential input transistor pair, a second differential input transistor pair, and a degeneration impedance. The method also includes providing the output current to the differential output stage using the feedback circuit and providing transition current to the differential output stage using the second differential input transistor pair when an input signal to the amplifier circuit has a frequency within a cut-off frequency bandwidth of the feedback circuit, and providing the output current and the transient current to the output stage using the second differential input transistor pair when the input signal has a frequency greater than the cut-off bandwidth of the feedback circuit.

In some aspects, a transconductance amplifier circuit includes a differential input stage and a differential output stage. The differential input stage includes a first differential input transistor pair coupled to a differential input of the amplifier circuit; a degeneration impedance coupled between transistors of the differential input transistor pair; a second differential input transistor pair coupled to the degeneration impedance; and a feedback circuit coupled to the first and second differential input transistor pairs and the degeneration impedance, wherein output current is provided from the differential input stage to the differential output stage by the second differential transistor pair and the feedback circuit.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

As explained previously herein, linear broadband amplifiers are required to process signals with every increasing fundamental input signal frequency, yet there is typically a tradeoff between linearity of the broadband amplifier and bandwidth and power consumption of the broadband amplifier.

Differential amplifiers can be divided into two sub-blocks consisting of a differential input stage and an output stage. For a transconductance amplifier, the differential input stage can be a transconductance stage that converts a differential input voltage to an output current, and the output stage converts the output current back to a differential or single-ended output voltage. The non-linearity of the transconductance-stage ultimately dominates the overall linearity of the amplifier at operating frequencies in the gigahertz (GHz) level. Consequently, linearizing the transconductance stage is a major goal towards achieving broadband linear amplifiers.

Figure 1:
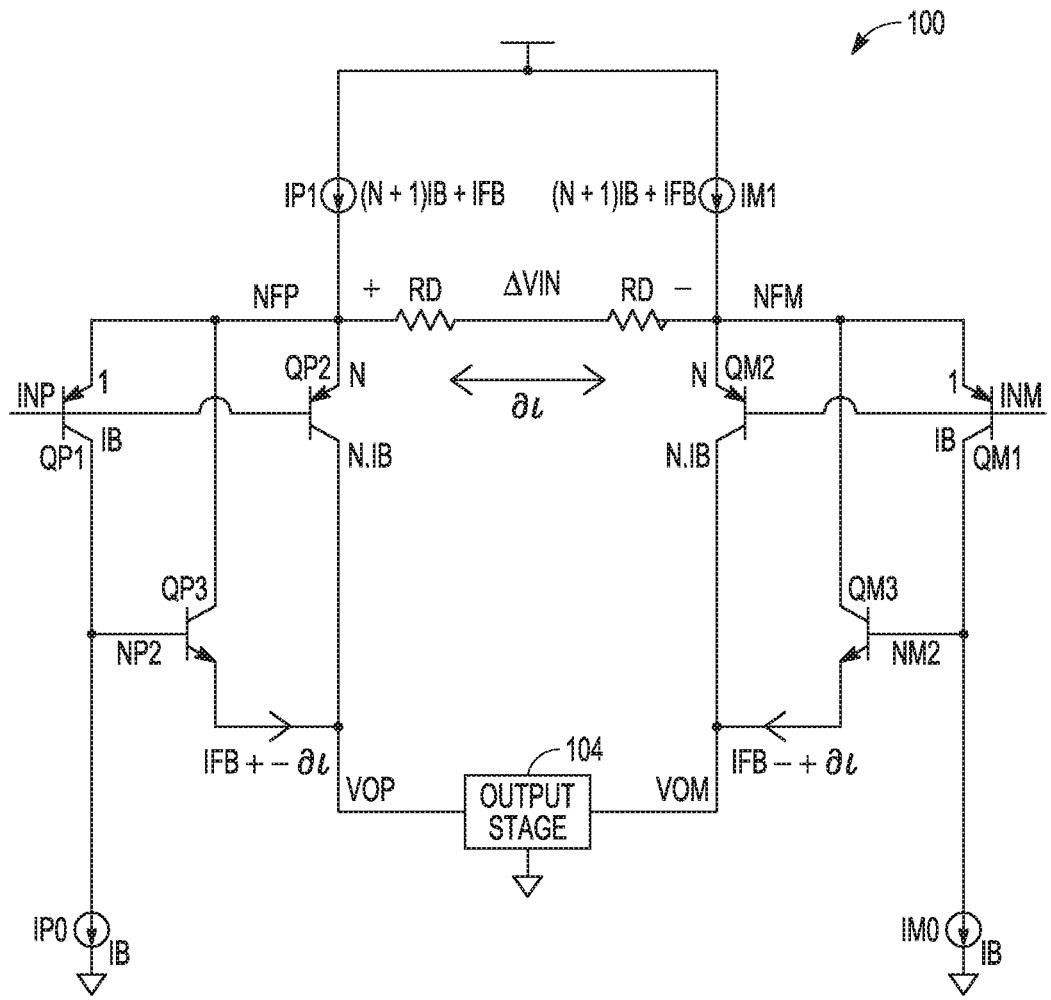
FIG. 1 is a circuit schematic of an example of a transconductance amplifier circuit.

FIG. 1 is a circuit schematic of an example of a transconductance amplifier circuit. The amplifier circuit 100 is a direct current (DC) coupled transconductance amplifier containing local linearization feedback circuitry to extend the linear bandwidth of the amplifier. The amplifier circuit 100 includes a differential input stage that is a transconductance stage, and a differential output stage 104.

The differential input stage includes a first differential input transistor pair QP1, QM1 coupled to the differential input INP, INM of the amplifier circuit, and a second differential input transistor pair QP2, QM2 coupled to the differential input and to the differential output stage 104 of the amplifier circuit. The transistors of the second differential input transistor pair are N multiples of the first differential input transistor pair, where N is greater than zero. The differential input stage also includes a degeneration impedance RD coupled between transistors QP1, QP2 and transistors QM1, QM2 of the differential input transistor pairs. The degeneration impedance converts the input signal difference to a current which adds to (and subtracts from) the quiescent bias current of the differential input transistor pairs to generate output current of the stage. The transconductance gain is set by the degeneration impedance.

The differential input stage further includes a feedback circuit coupled to the first and second differential input transistor pairs and the degeneration impedance. In the example of FIG. 1, the feedback circuit includes two feedback loops. Each feedback loop includes only two circuit nodes and a feedback transistor. One feedback includes circuit nodes NFP and VOP and feedback transistor QP3. The other feedback loop includes circuit nodes NFM and VOM and feedback transistor QM3.

The feedback transistors are a transistor type complementary to the type of transistor of the differential input transistor pairs. In the example of FIG. 1, the transistors of the differential input transistor pairs QP1, QM1, QP2, QM2 are PNP-type bipolar junction transistors (PNP-BJTs), and the feedback transistors QP3, QM3 are NPN-type bipolar junction transistors (NPN-BJTs). The emitter of transistor QP2 is coupled to current source IP1, and a collector of transistor QP3 is coupled to current source IP1. The emitter of transistor QM2 is coupled to current source IM1, and a collector of transistor QM3 is coupled to current source IM1. In another example, the transistors of the differential input transistor pairs QP1, QM1, QP2, QM2 are NPN-BJTs, and the feedback transistors QP3, QM3 are PNP-BJTs.

In other embodiments, the transistors are field effect transistors (FETs). The transistors of the differential input transistor pairs may be P-type FETs (PFETs), and the feedback transistors are N-type FETs (NFETs). In another example, the transistors of the differential input transistor pairs may be NFETs, and the feedback transistors are PFETs. The source regions of the FETs would be connected as the emitters in the example of FIG. 1, the drain regions of the FETs would be connected as the collectors, and the gate regions would be connected as the bases of the transistors of FIG. 1. In other embodiments, the transistors are complementary metal oxide semiconductor (CMOS) transistors. The transistors of the differential input transistor pairs may be PMOS, and the feedback transistors are NMOS, or the transistors of the differential input transistor pairs may be NMOS, and the feedback transistors are PMOS. In other embodiments, the transistors are bipolar CMOS (BiCMOS) transistors.

For the feedback loop containing QP3, the DC loop gain on the feedback loop containing QP3 is approximately $\beta_{NPN}/N$ due to the feedback signal division between QP1 and QP2 on circuit node NEP, where $\beta_{NPN}$ is the current gain of NPN bipolar transistor QP3 The feedback circuit has a cut-off frequency bandwidth. At frequencies lower than the cut-off frequency, output current is provided from the differential input stage to the differential output stage by the feedback circuit and transition current is provided to the output stage by the second differential input transistor pair QP2, QM2. The output current is conveyed to the amplifier output solely by QP3 transistor, because once the feedback loop settles, the QP1 and QP2 collector currents are forced to be equal to $I_B$ and N $I_B$, respectively. At the beginning of a transition, transistor QP2 connected directly to the circuit input takes charge and starts sourcing the output current. Next, the feedback loop comes in to the picture and the task of supplying output current shifts from transistor QP2 to QP3 until the collector current of QP2 returns to N·$I_B$ with the speed determined by the loop dynamics. The same is true for the feedback loop that contains QM3.

In this respect, the feedback circuit in effect takes an PNP-type bipolar junction transistor (PNP BJT) based differential pair (i.e., QP2 and QM2) and converts it to an NPN BJT based differential pair (i.e., QP3 and QM3). In another embodiment, transistors QP1, QP2, QM1, QM2 are NPN BJTs and transistors QP1 and QM3 are PNP BJTs. Other transistor types can be used for the differential transistor input pairs and the feedback circuit, but the transistors of the feedback circuit are a complementary type to the transistors of the differential transistor input pairs as explained previously herein.

For input signals with frequencies greater than the cut-off frequency bandwidth, the output current is provided from the differential input stage to the differential output stage by the second differential input transistor pair. Thus, the amplifier circuit 100 operates beyond the loop bandwidth of the feedback circuit. At high frequencies, current to the output stage transitions from being supplied by transistors QP3 and QM3 to being supplied solely by transistors QP2 and QM2.

Figure 2:
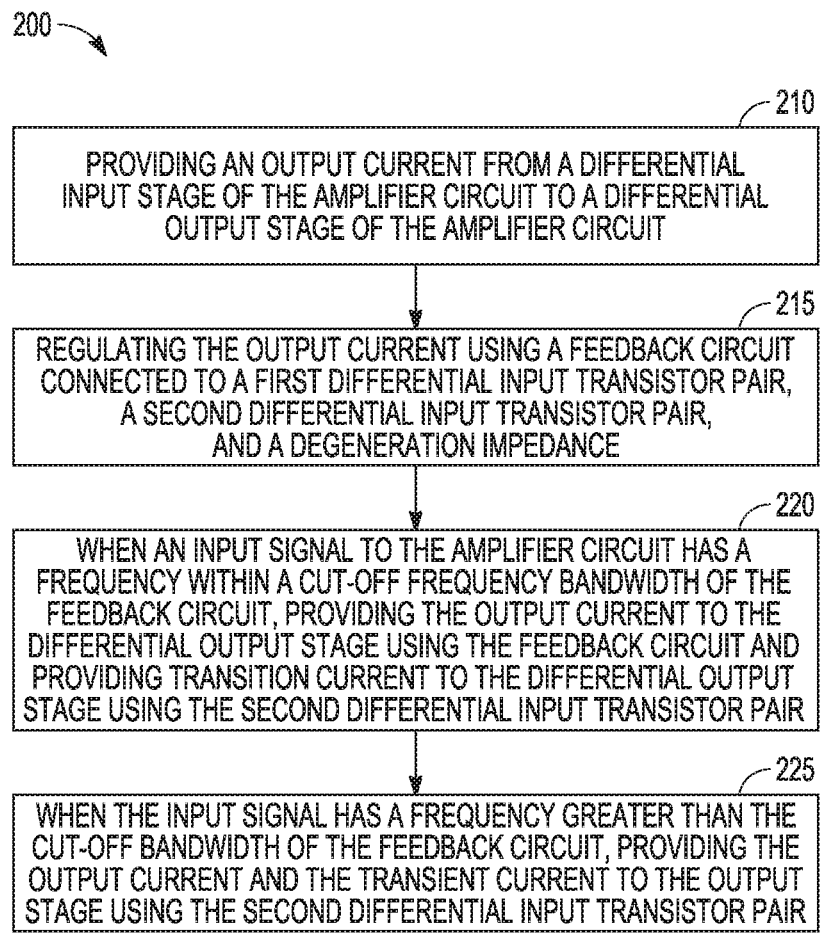
FIG. 2 is a flow diagram of an example of a method of operating an amplifier circuit.

FIG. 2 is a flow diagram of an example of a method 200 of operating an amplifier circuit. At 205, an output current is provided from a differential input stage of the amplifier circuit to a differential output stage of the amplifier circuit. The input stage may be a transconductance amplifier stage as in the example of FIG. 1, and the output stage may be a resistive output stage coupled to the transconductance stage. In some embodiments, the output stage may include a cascode amplifier stage.

At 210, the output current is regulated using a feedback circuit connected to a first differential input transistor pair, a second differential input transistor pair, and a degeneration impedance. The feedback circuit may include two feedback loops, each feedback loop is coupled to one of a positive input of the differential input of the amplifier and a negative input of the differential input of the amplifier. Each of the feedback loops includes a feedback transistor.

The feedback circuit has a cut-off frequency bandwidth. At 215, when an input signal to the amplifier circuit has a frequency within the cut-off bandwidth, the output current is provided to the differential output stage using the feedback circuit, and transition current is provided to the differential output stage using the second differential input transistor pair. At 220, when the input signal has a frequency greater than the cut-off bandwidth of the feedback circuit, the output current and the transient current are provided to the output stage using the second differential input transistor pair.

As explained above the transistors of the feedback circuit and the transistors of the differential input transistor pairs are of complementary types. Thus, as the input signal transitions from lower to higher than the cut-off frequency, the differential input transistor pair providing the output current transitions from one transistor type to a complementary transistor type. If BJT type transistors are used, the amplifier transitions from using a first-type BJT pair to provide the output current to using a second-type BJT pair, complementary to the first type, to provide the output current. If FET type transistors are used, the amplifier transitions from using a first-type FET pair to provide the output current to using a second-type FET pair, complementary to the first type, to provide the output current.

Figure 3:
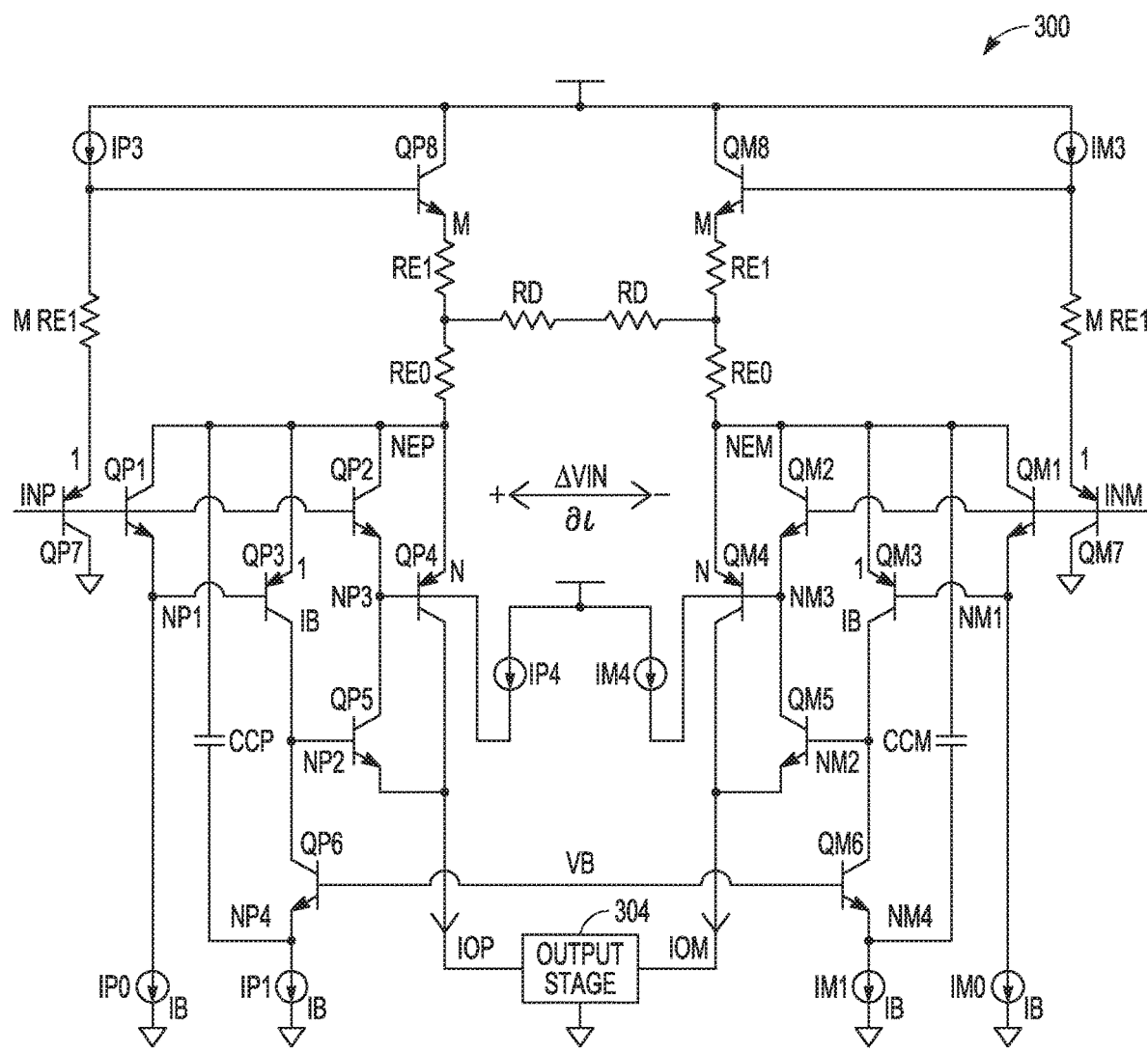
FIG. 3 is a circuit schematic of another example of a transconductance amplifier circuit.

FIG. 3 is a circuit schematic of another example of a transconductance amplifier circuit. The amplifier circuit 300 is a DC coupled transconductance amplifier containing local linearization feedback circuitry to extend the linear bandwidth of the amplifier. The amplifier circuit 300 includes a differential input stage, which is a transconductance stage, and a differential output stage 304.

The differential input stage includes a differential input transistor pair QP3, QM3 coupled to the differential input INP, INM of the amplifier circuit 300, and a degeneration impedance RD coupled between the transistors of the differential input transistor pair.

The amplifier circuit also includes a second differential input transistor pair QP4, QM4 coupled to the degeneration impedance, and a feedback circuit. The feedback circuit includes two feedback loops; one on the positive side of the amplifier circuit and one on the negative side. The two feedback loops are coupled to the differential input transistor pairs and the degeneration impedance. The positive feedback loop includes transistors QP2, QP3, QP4, QP5, and feedback circuit nodes NEP, NP2, NP5. The negative feedback loop includes transistors QM2, QM3, QM4, QM5, and feedback circuit nodes NEM, NM2, NM5. Output current is provided from the differential input stage to the differential output stage by differential transistor pair QP4, QM4 and the feedback circuit.

Each of the feedback loops includes compensation. The positive feedback loop includes a compensation capacitor CCP coupled to feedback circuit node NEP and current source IP1. Cascode transistor QP6 is coupled to transistor QP3 and current source IP1. The negative feedback loop includes compensation capacitor CCM, current source IM1, and cascode transistor QM6. A second current source IP4, IM4 is coupled to a feedback circuit node NP3, NM3, and to a transistor of the second differential input transistor pair QP4, QM4.

In the example of FIG. 3, the transistors are BJTs. In each of the feedback loops, a collector of a feedback loop transistor QP2, QM2, an emitter of a transistor of the first differential transistor pair QP3, QM3, and an emitter of a transistor of the second differential transistor pair QP4. QM4 are coupled to one of the feedback circuit nodes NEP, NEM. A collector of the transistor of the first differential transistor pair QP3, QM3 and a base of another feedback loop transistor QP5, QM5 are coupled to another feedback circuit node NP2, NM2. A collector of one of the feedback loop transistors QP5, QM5 and a base of the transistor of the second differential pair QP4, QM4 are coupled to a third feedback circuit node NP3, NM3. In other embodiments, the transistors are FETs. The connections to the emitters of the transistors of FIG. 3 are connections to the source regions of the FETs, the connections to the collectors of the transistors of FIG. 3 are connections to the drain regions of the FETs, and the connections to the base of the transistors of FIG. 3 are connections to the gate regions of the FETs.

Returning to the BJT example, the base current of transistors of the differential input transistor pairs QP3, QM3, QP4, QM4, adds a non-linearity to the output current. To improve linearity of the amplifier circuit 300, the feedback circuit cancels a base current component from the collector current of the differential input transistor pairs QP3, QM3, QP4, QM4. The feedback loops circulate the base current to cancel the non-linear base current component from the output current.

The feedback circuit of the amplifier has a cut-off frequency bandwidth. For input signals with frequencies greater than the cut-off frequency bandwidth, the feedback circuit ceases to provide current to the output stage, but the amplifier still functions at frequencies higher than the cut-off frequency bandwidth. The output current is provided to the output stage by the second differential input transistor pair.

The amplifier circuit 300 may include a floating current source coupled to the degeneration impedance and the differential input of the amplifier circuit. The floating current source includes transistors QP7, QP8, QM7, QM8, current sources IP3, IM3, and circuit impedance RE1. Transistors QP7, QM7 connect floating current source to the differential input. Transistors QP1 and QM1 provide a buffer between the differential input (INP, INM) and the first differential input transistor pair QP3, QM3.

Common mode and differential excitation stability are of prime concern for broadband amplifiers. The floating current source loads the feedback circuit for common mode excitation of the feedback loops and does not load the feedback circuit for differential excitation of the feedback loops. Common mode excitation refers to the voltage at feedback circuit nodes NP2 and NM2 changing together in the same direction, and the feedback loops are excited in common. Differential excitation refers to the voltages at nodes NP2 and NM2 changing in opposite direction, and the feedback loops are excited differentially. The excitation may originate at the differential input or by circuit noise anywhere in the amplifier circuit. The voltages at RE1 follow the input signal. The voltage difference at the nodes of impedance RE1 is always a constant. The floating current source does not load the differential transfer function of the amplifier and loads the common mode transfer function of the amplifier. This improves the common mode stability while not loading the feedback circuit when the feedback loops are excited differentially.

Because transistors QP8, QM8, are not part of the common mode transfer function, the transistors load nodes NEP, NEM to reduce the feedback signal generated by common mode signals. Transistors QP8, QM8 provide an additional degree of freedom to optimize the common mode DC gain and bandwidth. The capacitance of compensation capacitors CCP, CCM, can be selected to stabilize the differential feedback only rather than causing overcompensation to stabilize the common mode feedback.

The devices, systems and methods described herein provide amplifier circuits that improve linearity over a broad bandwidth that includes frequencies in the GHz range. The implementations of the examples of the Figures show a PNP bipolar differential pair based transconductance amplifier architecture in order to support low output common-mode voltage and broadband operation. The implementations can be modified to be complementary, i.e. the implementations may be NPN bipolar differential pair based, and/or CMOS, and/or bipolar CMOS (BiCMOS) based, or other design methodologies rather than using only bipolar transistors.

ADDITIONAL DESCRIPTION AND ASPECTS

Aspect 1 includes subject matter (such as an amplifier circuit) comprising a differential input stage and a differential output stage. The differential input stage includes a first differential input transistor pair coupled to a differential input of the amplifier circuit, and a second differential input transistor pair coupled to the differential input and the differential output stage; a degeneration impedance coupled between first transistors of the first and second differential input transistor pairs and second transistors of the first and second differential input transistor pairs; and a feedback circuit coupled to the first and second differential input transistor pairs and the degeneration impedance. Output current is provided from the differential input stage to the differential output stage by the feedback circuit and transition current is provided to the output stage by the second differential input transistor pair.

In Aspect 2, the subject matter of Aspect 1 optionally includes a feedback circuit having a cut-off frequency bandwidth, and for input signals with frequencies greater than the cut-off frequency bandwidth, the output_current is provided from the differential input stage to the differential output stage by the second differential input transistor pair.

In Aspect 3, the subject matter of one or both of Aspects 1 and 2 optionally includes the first and second transistors of the first and second differential input transistor pairs being a first transistor type, and the feedback circuit including transistors of a second transistor type complementary to the first transistor type.

In Aspect 4, the subject matter of one or any combination of Aspects 1-3 optionally includes a feedback circuit including a first feedback loop including a first feedback loop transistor coupled to the first transistors of the first and second differential input transistor pairs, and a second feedback loop including a second feedback loop transistor coupled to the second transistors of the first and second differential input transistor pairs. The first and second transistors of the second differential input transistor pair are a first transistor type and provide the transition current to the output stage, and the first and second feedback loop transistors are a second transistor type complementary to the first transistor type and provide the output current to the differential output stage.

In Aspect 5, the subject matter of Aspect 4 optionally includes the first transistor type is a PNP-type bipolar junction transistor (PNP-BJT), and the second transistor type is an NPN-type bipolar junction transistor (NPN-BJT).

In Aspect 6, the subject matter of Aspect 4 optionally includes the first transistor type is an NPN-type bipolar junction transistor (NPN-BJT), and the second transistor type is an PNP-type bipolar junction transistor (PNP-BJT).

In Aspect 7, the subject matter of Aspect 4 optionally includes transistors of the second differential input transistor pair and transistors of the first and second feedback loops are bipolar junction transistors (BJTs). The emitter of the first transistor of the second differential input transistor pair is coupled to a first current source and a collector of the first feedback loop transistor is coupled to the first current source, and the emitter of the second transistor of the second differential input transistor pairs is coupled to a second current source and a collector of the second feedback loop transistor is coupled to the second current source.

In Aspect 8, the subject matter of Aspect 4 optionally includes the first transistor type is a P-type field effect transistor (PFET), and the second transistor type is an N-type field effect transistor (NFET).

In Aspect 9, the subject matter of Aspect 4 optionally includes the first transistor type is a N-type field effect transistor (NFET), and the second transistor type is P-type field effect transistor (PFET).

In Aspect 10, the subject matter of Aspect 4 optionally includes transistors of the second differential input transistor pair and transistors of the first and second feedback loops are field effect transistors (FETs). The source of the first transistor of the second differential input transistor pair is coupled to a first current source and a drain of the first feedback loop transistor is coupled to the first current source, and the source of the second transistor of the second differential input transistor pairs is coupled to a second current source and a drain of the second feedback loop transistor is coupled to the second current source.

In Aspect 11, the subject matter of one or any combination of Aspects 1-10 optionally includes the first transistor of the second differential input transistor pair is a multiple of the first transistor of the first differential input transistor pair, and the second transistor of the second differential input transistor pair is a multiple of the second transistor of the first differential input transistor pair.

In Aspect 12, the subject matter of one or any combination of Aspects 1-3 optionally includes a feedback circuit including two feedback loops each comprising two feedback circuit nodes within a feedback path and a feedback transistor, and the feedback transistor and the transistors of the first and second differential input transistor pairs are bipolar junction transistors (BJTs). In each feedback loop a collector of the feedback transistor and an emitter of a transistor of the second differential input transistor pair are coupled to a first feedback circuit node of the feedback path, and a base of the feedback transistor and a collector of a transistor of the first differential input transistor pair are coupled to a second feedback circuit node of the feedback path.

Aspect 13 includes subject matter (such as a method of operating an amplifier circuit) or can optionally be combined with one or any combination of Aspects 1-12 to include such subject matter, comprising providing an output current from a differential input stage of the amplifier circuit to a differential output stage of the amplifier circuit; regulating the output current using a feedback circuit connected to a first differential input transistor pair, a second differential input transistor pair, and a degeneration impedance; and when an input signal to the amplifier circuit has a frequency within a cut-off frequency bandwidth of the feedback circuit, providing the output current to the differential output stage using the feedback circuit and providing transition current to the differential output stage using the second differential input transistor pair; and when the input signal has a frequency greater than the cut-off bandwidth of the feedback circuit, providing the output current and the transient current to the output stage using the second differential input transistor pair.

In Aspect 14, the subject matter of Aspect 13 optionally includes providing the output current to the differential output stage using a feedback circuit differential transistor pair when an input signal to the amplifier circuit has a frequency within the cut-off bandwidth of the feedback circuit, wherein transistors of the feedback circuit differential transistor pair are of a transistor type complementary to a transistor type of the second differential input transistor pair.

In Aspect 15, the subject matter of one or both of Aspects 13 and 14 optionally includes changing from using a first-type bipolar junction transistor pair to provide current to the output stage to using a second-type bipolar junction transistor pair, complementary to the first type, to provide the current to the output stage in response to a change at the differential input of the amplifier circuit.

In Aspect 16, the subject matter of one or both of Aspects 13 and 14 optionally includes changing from using a first-type field effect transistor pair to provide current to the output stage to using a second-type field effect transistor pair, complementary to the first type, to provide the current to the output stage in response to a change at the differential input of the amplifier circuit.

Aspect 17 includes subject matter (such as a transconductance amplifier circuit) or can optionally be combined with one or any combination of Aspects 1-16 to include such subject matter, comprising a differential input stage and a differential output stage. The differential input stage includes a first differential input transistor pair coupled to a differential input of the amplifier circuit, a degeneration impedance coupled between transistors of the differential input transistor pair, a second differential input transistor pair coupled to the degeneration impedance, and a feedback circuit coupled to the first and second differential input transistor pairs and the degeneration impedance, wherein output_current is provided from the differential input stage to the differential output stage by the second differential transistor pair and the feedback circuit.

In Aspect 18, the subject matter of Aspect 17 optionally includes a feedback circuit having a cut-off frequency bandwidth, and for input signals with frequencies greater than the cut-off frequency bandwidth, the output_current is provided to the output stage by the second differential input transistor pair.

In Aspect 19, the subject matter of one or both of Aspects 17 and 18 optionally includes a feedback circuit includes a floating current source circuit coupled to the degeneration impedance and the differential input, wherein the floating current source loads the feedback circuit for common mode excitation and does not load the feedback circuit for differential excitation.

In Aspect 20, the subject matter of one or any combination of Aspects 17-19 optionally includes a feedback circuit including two feedback loops. Each feedback loop comprises a feedback circuit node coupled to a transistor of the first differential input transistor pair, a cascode transistor coupled to the transistor of the first differential input transistor pair, a current source coupled to the cascode transistor, a compensation capacitor coupled to the feedback circuit node and the current source.

In Aspect 21, the subject matter of one or any combination of Aspects 17-19 optionally includes a feedback circuit including two feedback loops. Each feedback loop comprises three feedback circuit nodes and two feedback loop transistors, and the two feedback loop transistors of the two feedback loops and the transistors of the second differential transistor pairs are bipolar junction transistors (BJTs). In each feedback loop, a collector of a first feedback loop transistor, an emitter of a transistor of the first differential transistor pair, and an emitter of a transistor of the second differential transistor pair, are coupled to a first feedback circuit node of the feedback loop, a collector of the transistor of the first differential transistor pair and a base of a second feedback loop transistor are coupled to a second feedback circuit node of the feedback loop, and a collector of the second feedback loop transistor and a base of the transistor of the second differential pair are coupled to a third feedback circuit node.

In Aspect 22, the subject matter of Aspect 21 optionally includes in each of the feedback loops, a current source is coupled to the third feedback circuit node of the feedback loop, and a capacitor is coupled to the first feedback circuit node of the feedback loop.

In Aspect 23, the subject matter of one or both of Aspects 21 and 22 optionally includes a feedback circuit that cancels a base current component from a collector current of the first and second differential input transistor pairs.

In Aspect 24, the subject matter of one or any combination of Aspects 17-19 optionally includes a feedback circuit that includes two feedback loops. Each feedback loop comprising three feedback circuit nodes and two feedback loop transistors, and the two feedback loop transistors of the two feedback loops and the transistors of the second differential transistor pairs are field effect transistors (FETs). In each feedback loop, a drain of a first feedback loop transistor, a source of a transistor of the first differential transistor pair, and a source of a transistor of the second differential transistor pair are coupled to a first feedback circuit node; a drain of the transistor of the first differential transistor pair and a gate of a second feedback loop transistor are coupled to a second feedback circuit node; and a drain of the second feedback loop transistor and a gate of the transistor of the second differential pair are coupled to a third feedback circuit node.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An amplifier circuit comprising:
a differential input stage and a differential output stage, the differential input stage including:
a first differential input transistor pair coupled to a differential input of the amplifier circuit, and a second differential input transistor pair coupled to the differential input and the differential output stage, wherein the first and second transistors of the first and second differential input transistor pairs are a first transistor type;
a degeneration impedance coupled between first transistors of the first and second differential input transistor pairs and second transistors of the first and second differential input transistor pairs; and
a feedback circuit coupled to the first and second differential input transistor pairs and the degeneration impedance, wherein output current is provided from the differential input stage to the differential output stage by the feedback circuit and transition current is provided to the output stage by the second differential input transistor pair, and wherein the feedback circuit includes transistors of a second transistor type complementary to the first transistor type.

2. The amplifier circuit of claim 1, wherein the feedback circuit has a cut-off frequency bandwidth, and for input signals with frequencies greater than the cut-off frequency bandwidth, the output current is provided from the differential input stage to the differential output stage by the second differential input transistor pair.

3. The amplifier circuit of claim 1, wherein the feedback circuit includes:
a first feedback loop including a first feedback loop transistor coupled to the first transistors of the first and second differential input transistor pairs; and
a second feedback loop including a second feedback loop transistor coupled to the second transistors of the first and second differential input transistor pairs;
wherein the first and second transistors of the second differential input transistor pair are a first transistor type and provide the transition current to the output stage, and the first and second feedback loop transistors are a second transistor type complementary to the first transistor type and provide the output current to the differential output stage.

4. The amplifier circuit of claim 3, wherein the first transistor type is a PNP-type bipolar junction transistor (PNP-BJT), and the second transistor type is an NPN-type bipolar junction transistor (NPN-BJT).

5. The amplifier circuit of claim 3, wherein the first transistor type is an NPN-type bipolar junction transistor (NPN-BJT), and the second transistor type is an PNP-type bipolar junction transistor (PNP-BJT).

6. The amplifier circuit of claim 3,
wherein transistors of the second differential input transistor pair and transistors of the first and second feedback loops are bipolar junction transistors (BJTs); and
an emitter of the first transistor of the second differential input transistor pair is coupled to a first current source and a collector of the first feedback loop transistor is coupled to the first current source; and
an emitter of the second transistor of the second differential input transistor pairs is coupled to a second current source and a collector of the second feedback loop transistor is coupled to the second current source.

7. The amplifier circuit of claim 3, wherein the first transistor type is a P-type field effect transistor (PFET), and the second transistor type is an N-type field effect transistor (NFET).

8. The amplifier circuit of claim 3, wherein the first transistor type is a N-type field effect transistor (NFET), and the second transistor type is P-type field effect transistor (PFET).

9. The amplifier circuit of claim 3,
wherein transistors of the second differential input transistor pair and transistors of the first and second feedback loops are field effect transistors (FETs); and
a source of the first transistor of the second differential input transistor pair is coupled to a first current source and a drain of the first feedback loop transistor is coupled to the first current source; and
a source of the second transistor of the second differential input transistor pairs is coupled to a second current source and a drain of the second feedback loop transistor is coupled to the second current source.

10. The amplifier circuit of claim 1, wherein the first transistor of the second differential input transistor pair is a multiple of the first transistor of the first differential input transistor pair, and the second transistor of the second differential input transistor pair is a multiple of the second transistor of the first differential input transistor pair.

11. The amplifier circuit of claim 1,
wherein the feedback circuit includes two feedback loops each comprising two feedback circuit nodes within a feedback path and a feedback transistor, and the feedback transistor and the transistors of the first and second differential input transistor pairs are bipolar junction transistors (BJTs); and
wherein in each feedback loop a collector of the feedback transistor and an emitter of a transistor of the second differential input transistor pair are coupled to a first feedback circuit node of the feedback path, and a base of the feedback transistor and a collector of a transistor of the first differential input transistor pair are coupled to a second feedback circuit node of the feedback path.

12. A method of operating an amplifier circuit, the method comprising:
providing an output current from a differential input stage of the amplifier circuit to a differential output stage of the amplifier circuit;
regulating the output current using a feedback circuit connected to a first differential input transistor pair, a second differential input transistor pair, and a degeneration impedance; and
when an input signal to the amplifier circuit has a frequency within a cut-off frequency bandwidth of the feedback circuit, providing the output current to the differential output stage using the feedback circuit and providing transition current to the differential output stage using the second differential input transistor pair; and
when the input signal has a frequency greater than the cut-off bandwidth of the feedback circuit, providing the output current and the transient current to the output stage using the second differential input transistor pair.

13. The method of claim 12, wherein providing the output current to the differential output stage using the feedback circuit includes providing the output current to the differential output stage using a feedback circuit differential transistor pair when an input signal to the amplifier circuit has a frequency within the cut-off bandwidth of the feedback circuit, wherein transistors of the feedback circuit differential transistor pair are of a transistor type complementary to a transistor type of the second differential input transistor pair.

14. The method of claim 12, including changing from using a first-type bipolar junction transistor pair to provide current to the output stage to using a second-type bipolar junction transistor pair, complementary to the first type, to provide the current to the output stage in response to a change at the differential input of the amplifier circuit.

15. The method of claim 12, including changing from using a first-type field effect transistor pair to provide current to the output stage to using a second-type field effect transistor pair, complementary to the first type, to provide the current to the output stage in response to a change at the differential input of the amplifier circuit.

16. A transconductance amplifier circuit comprising:
a differential input stage and a differential output stage, the differential input stage including:
a first differential input transistor pair coupled to a differential input of the amplifier circuit;
a degeneration impedance coupled between transistors of the differential input transistor pair;
a second differential input transistor pair coupled to the degeneration impedance; and
a feedback circuit coupled to the first and second differential input transistor pairs and the degeneration impedance, wherein output current is provided from the differential input stage to the differential output stage by the second differential transistor pair and the feedback circuit, wherein the feedback circuit has a cut-off frequency bandwidth, and for input signals with frequencies greater than the cut-off frequency bandwidth, the output current is provided to the output stage by the second differential input transistor pair.

17. The transconductance amplifier circuit of claim 16, wherein the feedback circuit includes a floating current source circuit coupled to the degeneration impedance and the differential input, wherein the floating current source loads the feedback circuit for common mode excitation and does not load the feedback circuit for differential excitation.

18. The transconductance amplifier circuit of claim 16, wherein the feedback circuit includes two feedback loops, each feedback loop comprising:
a feedback circuit node coupled to a transistor of the first differential input transistor pair;
a cascode transistor coupled to the transistor of the first differential input transistor pair;
a current source coupled to the cascode transistor; and
a compensation capacitor coupled to the feedback circuit node and the current source.

19. The transconductance amplifier circuit of claim 16,
wherein the feedback circuit includes two feedback loops, each feedback loop comprising three feedback circuit nodes and two feedback loop transistors, and the two feedback loop transistors of the two feedback loops and the transistors of the second differential transistor pairs are bipolar junction transistors (BJTs); and
wherein, in each feedback loop,
a collector of a first feedback loop transistor, an emitter of a transistor of the first differential transistor pair, and an emitter of a transistor of the second differential transistor pair, are coupled to a first feedback circuit node of the feedback loop,
a collector of the transistor of the first differential transistor pair and a base of a second feedback loop transistor are coupled to a second feedback circuit node of the feedback loop, and
a collector of the second feedback loop transistor and a base of the transistor of the second differential pair are coupled to a third feedback circuit node.

20. The transconductance amplifier circuit of claim 19, wherein in each of the two feedback loops, a current source is coupled to the third feedback circuit node of the feedback loop, and a capacitor is coupled to the first feedback circuit node of the feedback loop.

21. The transconductance amplifier circuit of claim 19, wherein the feedback circuit cancels a base current component from a collector current of the first and second differential input transistor pairs.

22. The transconductance amplifier circuit of claim 16,
wherein the feedback circuit includes two feedback loops, each feedback loop comprising three feedback circuit nodes and two feedback loop transistors, and the two feedback loop transistors of the two feedback loops and the transistors of the second differential transistor pairs are field effect transistors (FETs); and
wherein, in each feedback loop,
a drain of a first feedback loop transistor, a source of a transistor of the first differential transistor pair, and a source of a transistor of the second differential transistor pair are coupled to a first feedback circuit node,
a drain of the transistor of the first differential transistor pair and a gate of a second feedback loop transistor are coupled to a second feedback circuit node, and
a drain of the second feedback loop transistor and a gate of the transistor of the second differential pair are coupled to a third feedback circuit node.

* * * * *